(12) United States Patent
Shibata et al.

(10) Patent No.: US 6,805,982 B2
(45) Date of Patent: Oct. 19, 2004

(54) EPITAXIAL SUBSTRATES AND SEMICONDUCTOR DEVICES

(75) Inventors: Tomohiko Shibata, Kasugai (JP); Keiichiro Asai, Nagoya (JP); Shigeaki Sumiya, Handa (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/425,734

(22) Filed: Apr. 30, 2003

(65) Prior Publication Data

US 2003/0213949 A1 Nov. 20, 2003

(30) Foreign Application Priority Data

Jan. 14, 2003 (JP) ........................................ 2003-005601

(51) Int. Cl.[7] ............................. B32B 9/00; H01L 29/12
(52) U.S. Cl. ........................ 428/698; 428/697; 428/699; 428/702; 428/336; 257/294; 257/103; 117/952
(58) Field of Search ................................ 428/698, 697, 428/699, 701, 702, 336; 257/94, 103; 117/952

(56) References Cited

U.S. PATENT DOCUMENTS

2002/0125491 A1 * 9/2002 Shibata et al. ................. 257/94

FOREIGN PATENT DOCUMENTS

| JP | 52047377 A | * | 4/1977 | ........... H01L/21/31 |
| JP | 2002329863 A | * | 11/2002 | ........... H01L/29/78 |

* cited by examiner

Primary Examiner—Stephen Stein
(74) Attorney, Agent, or Firm—Oliff & Berridge, PLC

(57) ABSTRACT

A group III nitride film is formed on an epitaxial substrate having an underlayer film containing Al. According to the present invention, the change of the properties of the II nitride film may be reduced The properties of the semiconductor device may be thus reduced and the production yield may be improved. An underlayer 2 made of a group III nitride containing at least Al is formed on a substrate 1 made of a single crystal. An oxide film 3 is formed on the underlayer film 2 to produce an epitaxial substrate 10. The oxygen content of the oxide film 3 at the surface is not lower than 3 atomic percent and the thickness is not larger than 50 angstrom.

7 Claims, 1 Drawing Sheet

US 6,805,982 B2

EPITAXIAL SUBSTRATES AND SEMICONDUCTOR DEVICES

This application claims the benefits of Japanese Patent Applications P2002-141340, filed on May 16, 2002, and P2003-5601, filed on Jan. 14, 2003, the entireties of which are incorporated by reference.

BACKGROUND OF THE INVENTION

1. Field of the Invention

The present invention relates to an epitaxial, substrate. The substrate may be used as substrates for photonic and electronic devices, and devices such as a field emitter.

2. Related Art Statement

A film of a group III nitride film has been used as a semiconductor film constituting a semiconductor device such as photonic and electronic devices, and expected, in recent years, as a semiconductor film for a high-speed IC chip used for a mobile phone system. Particularly, a film of a group III nitride containing Al has been expected in an application of a field emitter.

A so-called epitaxial substrate has been used as a substrate having the above nitride film. Such epitaxial substrate has a predetermined substrate and an underlayer film formed on the substrate by epitaxial growth. The epitaxial substrate is mounted on a susceptor provided in a reactor, and heated at a predetermined temperature by means of a heating system provided inside or outside of the susceptor. Raw materials for supplying a group III metal and nitrogen and optionally another element are introduced into the reactor with a carrier gas to the epitaxial substrate. A group III nitride film is thus produced using a CVD process to obtain a semiconductor device.

SUMMARY OF THE INVENTION

In most cases, the epitaxial substrate, which is produced and removed out from the reactor, is kept in air over several hours or days before the above film forming process is performed. In this case, the properties of the group III nitride film formed on the epitaxial substrate may be changed depending on the ambient conditions in keeping. The properties of the semiconductor device using III nitride film may be also deviated from initially designed values.

Such tendency becomes considerable as the content of Al in the underlayer of the epitaxial substrate is increased. When a group III nitride film is produced on the epitaxial substrate containing the underlayer including Al, the production yield of semiconductor devices using III nitride film on the epitaxial substrate may be thus considerably reduced.

An object of the present invention is, when a group III nitride film is formed on an epitaxial substrate containing an underlayer film containing Al, to reduce the deviation of the properties of the group III nitride film.

Another object of the present invention is to reduce the deviation of the properties of a semiconductor device using the epitaxial substrate and thereby improve the production yield.

The present invention provides an epitaxial substrate, comprising a substrate of a single crystal, an underlayer film provided on the substrate and substantially made of a nitride of a group III element at least including Al, and an oxide film formed on the underlayer. The oxide film has an oxygen content of not lower than 3 atomic percent at the surface and a thickness of not larger than 50 angstrom.

The inventors have studied to provide a solution to the above problems. They finally attained the following discoveries. That is, when an epitaxial substrate is kept in air as described above, the surface may be oxidized to form an oxide film. It is found that the oxide film substantially affects the properties of a group III nitride film after the III nitride film is formed on the epitaxial substrate.

According to the invention, the surface of the epitaxial substrate, specifically the oxide film formed on the underlayer film of the substrate is controlled so that the oxide film satisfies specified properties. The change or deviation of the physical properties of the group III nitride film formed on the epitaxial substrate may be thus successfully reduced. The present invention is based on the discovery.

According to the present invention, as long as the oxide film formed on the underlayer film of the epitaxial substrate satisfies the requirements of the invention, it is possible to reduce the change of the physical properties of a group III nitride film formed on the epitaxial substrate, irrelevant of the state of preservation of the epitaxial substrate. It is thus possible to reduce the change or deviation of properties of a semiconductor device and to improve the production yield thereof.

In a preferred embodiment, the surface roughness Ra of the oxide film may preferable be not larger than 5 angstrom. It is thus possible to effectively reduce the change of physical properties of the III nitride film formed on the epitaxial substrate and to effectively reduce the change of properties of the semiconductor device so that the production yield may be further improved.

Further, the oxygen content at the surface and thickness of the oxide film are measured as follows. That is, the underlayer of a group III nitride is etched in a direction of thickness using Ar ions and the composition is analyzed using ESCA. The thus obtained analytic data in the direction of thickness are used to obtain the oxygen content at the surface and oxide film thickness.

The details for the ESCA analysis are as follows. X-ray having an energy of 1253.6 eV using an Mg target is used. The analysis is performed over a measured area of 1.1 mm $\phi$, a detection angle of 45 degree, and a path energy of 35.75 eV. Oxygen atoms are identified by means of $O_{1s}$ spectra. Pressure during the measurement is $3\times10^{-9}$ Torr. The etching was performed using $Ar^+$ ions with an accelerating voltage of 3.0 kV in a raster area of 3 mm×3 mm.

The etching rate under the above conditions was proved to be 42 angstrom/min. for $SiO_2$ and ¼ of that for $SiO_2$ in the case of $Al_2O_3$. The sputtering rate of the underlayer is calculated for convenience from the etching rate for $Al_2O_3$. The time period required for etching 1 nm is then calculated from the etching rate. The oxygen content at the starting time point of the etching process is deemed as the above oxygen content at the surface. The thickness of the oxide film is calculated based on the etching rate and a time period until the residual surface oxygen disappears. The lower limit for the detection of oxygen is 0.5 atomic percent based on the above process.

Further, in another preferred embodiment, the oxygen content of the underlayer film containing Al under the oxide film is not larger than $10^{19}/cm^3$ at a depth of 0.2 $\mu$m from the surface, which means it is important to reduce oxygen content in the underlayer film under the oxide film as low as possible. The low oxygen content in the underfilm can make the oxide film high quality at the surface of underfilm. As a result, it is possible to reduce the influence of the underlayer film on the change of properties of the group III nitride film and to effectively prevent the change of properties of the semiconductor device so that the production yield may be further improved, The oxygen content of the underlayer film containing Al is very small as described above and may be below the detection limit of ESCA. The oxygen content is thus measured by means of SIMS.

The details of the SIMS measurement are as follows. A sector magnetic field type-SIMS system, fabricated by CAMECA, is used. 14.5 keV of $Cs^+$ is used as the primary ion and a minus ion is used as the secondary ion. The introduction of oxygen and correction of charge are not performed in the measurement. A gold film is then coated by vapor deposition on the surface of the underlayer film containing Al to prevent the effects of charge up. A cold trap using liquid nitrogen is used to minimize the effects of impurities in atmosphere. Further, the oxygen content at a depth of 0.2 μm from the surface is obtained from a depth profile obtained by etching in the direction of thickness. The value of the oxygen content is decided based on a standard sample for ion implantation. The limit of detection is $7 \times 10^{16}/cm^3$.

The effects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

Figure 1:
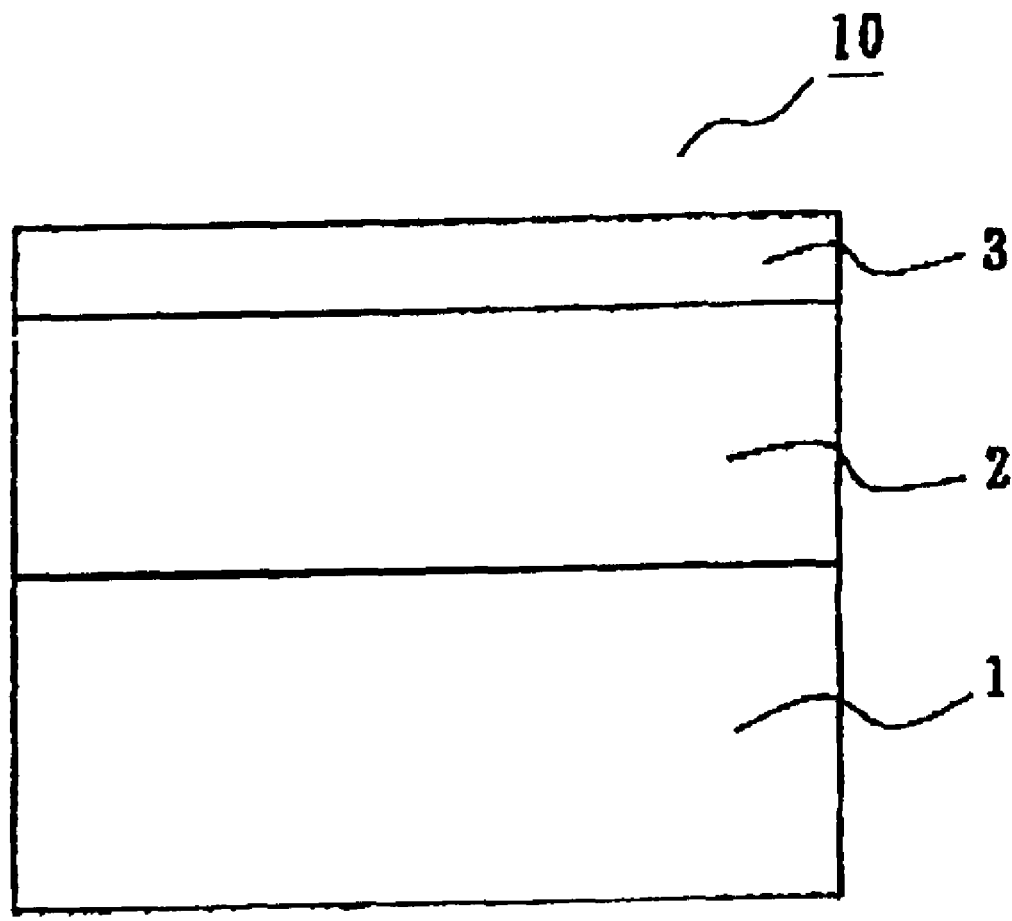
FIG. 1 is a diagram schematically showing an epitaxial substrate according to the present invention.

Description will be made for the present invention in detail, referring to the preferred embodiments.

FIG. 1 is a diagram schematically showing an epitaxial substrate according to the present invention. As shown in FIG. 1, an epitaxial substrate 10 of the invention has a predetermined substrate 1 made of a single crystal, an underlayer film 2 and an oxide film 3 formed on the underlayer film 2. The underlayer film 2 is made of a group III nitride containing at least Al.

The oxygen content of the oxide film 3 is not lower than 3 atomic percent and sore preferably be not lower than 5 atomic percent and not higher than 10 atomic percent. The thickness of the oxide Film 3 is not larger than 50 angstrom, and more preferably be 10 to 40 angstrom. It is thus possible to reduce the change of the physical properties of a group III nitride film when such film is formed on the oxide film 3, and to effectively reduce the change of properties of the semiconductor device using the III nitride film. The thickness of the oxide film 3 is defined as a thickness of a region in which the oxygen content in not smaller than 1 atomic percent, based on the analysis of composition by means of ESCA.

Further, the surface roughness Ra of the oxide film 3 may preferably be not larger than 5 angstrom as described above, and more preferably be not larger than 2 angstrom. It is thus possible to effectively improve the advantageous effects of the invention.

Further, the oxygen content in the underlayer film 2 at a depth of 0.2 μm from the surface of the film 2 may preferably be not higher than $10^{19}/cm^3$, more preferably be not higher than $5 \times 10^{18}/cm^3$, and most preferably not higher than $10^{18}/cm^3$. It is thus possible to reduce the effects of the underlayer film 2 on the change of properties of the group III nitride film on the oxide film 3. It is farther possible to effectively reduce the deviation and change of properties of a semiconductor device and to further improve the production yield.

The oxide film a may be produced by any processes not particularly limited, as long as the above properties are satisfied. The substrate 1 made of a single crystal is set in a specified reactor and the underlayer film 2 is formed thereon by means of CVD process or the like to provide the epitaxial substrate 10 shown in FIG. 1. The oxygen and moisture contents in the process may be appropriately controlled to produce the oxide. film 3 satisfying the above requirements of the invention easily.

Preferably, the properties of the underlayer film 2 may be controlled as follows. Specifically, the full width at half maximum value of an X-ray rocking curve of the (002) plane of the underlayer film 2 may preferably be not higher than 200 seconds, and more preferably be not higher than 100 seconds. It is thus possible to produce the oxide film 3 satisfying the requirements of the present invention easily, irrelevant of conditions for the production process of the epitaxial substrate 10. That is, the oxide film 3 satisfying the above requirements may be produced by means of a conventional process for producing the epitaxial substrate and setting the epitaxial substrate in air.

In this case, the oxide film 3 satisfying the above requirements may be easily obtained, independent of keeping condition of the epitaxial substrate 10 in air.

The underlayer film 2 having the above excellent crystallinity may be obtained by adjusting the temperature of the substrate 1 itself not lower than 1100° C., more preferably not lower than 1250° C. in the process of forming the underlayer 2 by, for example, CVD process. The thickness of the underlayer film 2 may preferably be not smaller than 0.5 μM, and more preferably be not lower than 1 to 3 μm.

The advantageous effects of the present invention is made more considerable as the content of Al in the underlayer film 2 is increased. Further, the crystallinity of the underlayer film 2 may be further improved as the content of Al in the underlayer film 2 is increased, when the underlayer film 2 is formed while the temperature of the substrate 1 is adjusted at the high temperature range described above. On this viewpoint, the content of Al in the underlayer film 2 may preferably be not lower than 50 atomic percent, and more preferably be 100 atomic percent (the underlayer film is composed of AlN), based on a total of contents of group III elements.

The underlayer film 2 may contain a group III element such as Ga and In other than Al. The film 2 may optionally contain Mg, Si, B or the like. Further, the underlayer film 2 may contain elements added to the raw material as well as inevitable impurities included depending on the film-forming conditions and trace impurities contained in the raw materials and material of the reactor.

The substrate 1 may be made of a single crystal such as known single crystals including sapphire, ZnO, SiC, Si, GaAs, AlGaN, $LiAlO_2$, $LiGaO_2$, $MgAl_2O_4$, MgO and so forth. More preferably, crystal orientation of surface face of the single crystals may be selected so as to grow (0001)-faced underlayer film of the group III nitride, such as (0001)-faced sapphire, (0001)-faced ZnO, (0001)-faced SiC, (0001)-faced AlGaN, (11-20)-faced sapphire, (111)-faced Si, (111)-faced GaAs. Here, (0001)-faced is equal to C-faced.

EXAMPLES

Inventive Example

In this example, the epitaxial substrate 10 shown in FIG. 1 was fabricated, on which a GaN film is formed. A c-faced sapphire single crystal substrate was used as the substrate 1 and mounted on a susceptor installed in a reactor made of quartz. After the pressure was set at 15 Torr, hydrogen carrier gas was supplied at a flow rate of 3 m/sec. The substrate was heated at 1200° C. with a heater.

Subsequently, trimethyl aluminum (TMA) was used as a source for Al and ammonia gas ($NH_3$) was used as a source for nitrogen. These raw material gases were supplied into the reactor and to the substrate with hydrogen carrier gas so that the molar ratio of TMA and $NH_3$ was adjusted at 1:450. AlN film was epitaxially grown as the underlayer film for 120 minutes to a thickness of 2 μm to obtain an epitaxial substrate.

The composition of the AlN film in the direction of depth was analyzed by means of ESCA as described above. It was thus proved that an oxide film having an oxygen content of 6 atomic percent at the surface, a thickness of 30 angstrom and surface roughness of 1.5 angstrom was formed on the surface of the AlN film. Further, the oxygen content was below the detection limit by means of ESCA in a region below 30 angstrom from the surface.

Further, the oxygen content of the AlN film was not higher than $1.5 \times 10^{17}/cm^3$ at a depth of 0.2 μm. At the depth, the content of H was $5 \times 10^{17}/cm^3$, the content of C was $5 \times 10^{16}/cm^3$, and the content of Si was $3 \times 10^{16}/cm^3$. It was further proved that the AlN film was epitaxially grown and had a full width at half maximum of an X-ray rocking curve of the (002) face of 60 seconds.

Triethyl galium (TMG) was used as a source for Ga and $NH_3$ gas was used as a source for nitrogen. These raw material gases were supplied into the reactor and to the epitaxial substrate with hydrogen carrier gas so that the molar ratio of TMG and $NH_3$ was adjusted at 1:2000. A film of GaN was thus formed to a thickness of 3 μm.

The crystallinity of the GaN film was measured to prove that the dislocation density was $1 \times 10^8/cm^3$ and the full width at half maximum of a rocking curve of the (002) plane was not larger than 120 seconds.

Comparative Example 1

A c-face sapphire substrate was used as the substrate of single crystal. The underlayer film of AlN was produced according to the same process as in the inventive example to produce an epitaxial substrate, except that the substrate was heated at 900° C. and the thickness of the underlayer film was 0.05 μm. The composition was analyzed by means of ESCA in the depth of the AlN film. It was thus proved that the surface roughness was 10 angstrom and the oxygen content at the surface was 12 atomic percent. The oxygen content was proved to be not lower than 2 atomic percent in the substantially whole thickness of the film. The crystallinity of the AlN Mm was observed by means of TEM so that the presence of crystal growth in the other direction than (0001) plane was confirmed.

A GaN film of a thickness of 3 μm was formed on the epitaxial substrate as in the inventive example. The crystallinity of the GaN film was measured to prove that the dislocation density was $1 \times 10^9/cm^2$ and the fall width at half maximum of a rocking curve of the (002) plane was about 250 seconds.

Comparative Example 2

A c-face sapphire substrate was used as the substrate of single crystal. The underlayer film of AlN was produced according to the same process as in the inventive example to produce an epitaxial substrate, except that the substrate was heated at 800° C. and the thickness of the underlayer film was 1.0 μm. The composition was analyzed by means of ESCA in the depth of the AlN film. It was thus proved that the surface roughness was 100 angstrom and the oxygen content at the surface was 15 atomic percent. The oxygen content was proved to be not lower than 2 atomic percent in the substantially whole thickness of the film. The crystallinity of the AlN film was observed by means of TEM so that the presence of crystal growth in the other direction was confirmed.

A GaN film of a thickness of 3 μm was formed on the epitaxial substrate as in the inventive example. The crystallinity of the GaN film was measured to prove that the dislocation density was $5 \times 10^9/cm^2$ and the full width at half maximum of a rocking curve of the (002) plane was about 500 seconds.

Comparative Example 3

A c-face sapphire substrate was used as the substrate of single crystal. The underlayer film of AlN was produced according to the same process as in the inventive example to produce an epitaxial substrate, except that the substrate was heated at 1000° C. and the thickness was 1.0 μm. The composition was analyzed by means of ESCA in the depth of the AlN film. It was thus proved that the surface roughness was 50 angstrom and the oxygen content at the surface was 12 atomic percent. The oxygen content was proved to be not lower than 1 atomic percent in the substantially whole thickness of the film. The full width at half maximum of a rocking curve of the (002) plane was about 250 seconds.

A GaN film of a thickness of 3 μm was formed on the epitaxial substrate as in the inventive example. The crystallinity of the GaN film was measured to prove that the dislocation density was $5 \times 10^9/cm^2$ and the full width at half maximum of a rocking curve of the (002) plane was about 300 seconds.

As can be seen from the above inventive and comparative examples, the GaN film formed on the epitaxial substrate having the oxide m satisfying the requirements of the present invention has the excellent crystallinity. That is, the dislocation density and full width at half maximum of x-ray rocking curve are above specific standards. The change of the physical properties may be thus effectively reduced.

The present invention has been described referring to the specific embodiments. The invention is not limited to the above embodiments. The change and variations may be applied as long as they are within the scope of the invention.

For example, a buffer layer or a film of a multilayered structure such as a strain superlattice may be inserted between the substrate of single crystal and underlayer film. It is thus possible to improve the crystallinity of the underlayer film and thus to improve the crystallinity of the group III nitride film to be formed on the epitaxial substrate.

As described above, according to the present invention, when a group III nitride film is formed on an epitaxial substrate containing an underlayer film of a group III nitride containing Al, the change of the properties of the III nitride film may be reduced. Moreover, when a semiconductor device having the epitaxial substrate and group III nitride film is produced, the deviation of device properties may be reduced and the production yield may be thus improved.

What is claimed is:

1. An epitaxial substrate, comprising a single crystal substrate, an underlayer film provided on said single crystal substrate and substantially made of a nitride of a group III element at least including Al, and an oxide film formed on said underlayer film, wherein said oxide film has an oxygen content at the surface of said oxide film of not lower than 3 atomic percent and a thickness of not larger than 50 angstrom.

2. The epitaxial substrate of claim 1, wherein said oxide film has a surface roughness Ra of not larger than 5 angstrom.

3. The epitaxial substrate of claim 1, wherein said underlayer film contains Al in an amount of not lower than 50 atomic percent based on a total of contents of all the III elements.

4. The epitaxial substrate of claim 3, wherein said underlayer film is substantially composed of AlN.

5. The epitaxial substrate of claim 1, wherein said underlayer film has a full width at half maximum value of an x-ray rocking curve of (002) plane of not larger than 200 seconds.

6. The epitaxial substrate of claim 1, wherein said underlayer film has an oxygen content of not higher than $10^{19}/cm^3$ at a depth of 0.2 $\mu$m from a surface of said underlayer film.

7. A semiconductor device comprising said epitaxial substrate of claim 1.

* * * * *

UNITED STATES PATENT AND TRADEMARK OFFICE
CERTIFICATE OF CORRECTION

PATENT NO.   : 6,805,982 B2
DATED        : October 19, 2004
INVENTOR(S)  : Tomohiko Shibata et al.

It is certified that error appears in the above-identified patent and that said Letters Patent is hereby corrected as shown below:

<u>Title page,</u>
Item [30], Foreign Application Priorty Data, add
-- May 16, 2002 (JP) 2002-141340 --.

Signed and Sealed this

Nineteenth Day of April, 2005

JON W. DUDAS
*Director of the United States Patent and Trademark Office*